United States Patent
Yoshida

[11] Patent Number: 6,016,566
[45] Date of Patent: Jan. 18, 2000

[54] COMPARATOR FOR SEMICONDUCTOR TESTING DEVICE

[75] Inventor: Kenji Yoshida, Tokyo, Japan

[73] Assignee: Advantest Corp., Tokyo, Japan

[21] Appl. No.: 08/913,349

[22] PCT Filed: Jan. 20, 1997

[86] PCT No.: PCT/JP97/00102

§ 371 Date: Feb. 9, 1998

§ 102(e) Date: Feb. 9, 1998

[87] PCT Pub. No.: WO97/27493

PCT Pub. Date: Jul. 31, 1997

[30] Foreign Application Priority Data

Jan. 23, 1996 [JP] Japan ................... 8-028552

[51] Int. Cl.[7] ............ G01R 31/28; H01H 61/00
[52] U.S. Cl. ............................. 714/736; 327/68
[58] Field of Search ................... 714/736, 819; 327/94, 96, 89, 68; 340/659

[56] References Cited

U.S. PATENT DOCUMENTS 5,210,527  5/1993  Smith et al. ................ 340/659
5,436,559  7/1995  Takagi et al. ............... 324/158.1

FOREIGN PATENT DOCUMENTS 63-233382   9/1988  Japan .
7-156744    6/1995  Japan .
7-270383   10/1995  Japan .

Primary Examiner—Albert De Cady
Assistant Examiner—Shelly A. Chase
Attorney, Agent, or Firm—Muramatsu & Associates

[57] ABSTRACT

A comparator circuit for differential output signals which is not affected by a common mode noise on the differential signals. The comparator circuit is advantageously used for testing differential output signals from a device under test (DUT). The comparator circuit includes an offset circuit for receiving differential signals from the DUT and generating a pair of balanced output signals which is provided with a predetermined offset voltage therebetween, and a comparator for receiving the pair of output signals from the offset circuit and comparing voltages between the output signals.

4 Claims, 6 Drawing Sheets (a)

(b)

(a)

(b)

COMPARATOR FOR SEMICONDUCTOR TESTING DEVICE

FIELD OF THE INVENTION

This invention relates to a comparator circuit to be used in a semiconductor test system for comparing differential output signals of a semiconductor device under test (DUT).

BACKGROUND OF THE INVENTION

In testing differential output signals of DUT, there are two test items. In the first test item, it is tested whether each of the output signals is proper or not (single output test), and in the second test item, it is tested whether the differential output signals as a whole are proper or not (differential output test). This invention relates to the second test item to determine whether the differential output signals are working properly.

The number of semiconductor devices (DUTs) to be operated with small signal levels is increasing these days. These small signal DUTs often have an interface of balanced transmission drive. Accordingly, more detailed quality test is required to evaluate DUTs which function under the balanced transmission condition.

FIG. 6 shows a circuit configuration of a comparator circuit 90 in the conventional technology for one channel of a semiconductor test system. The comparator circuit 90 compares differential output signals, i.e., balanced transmission signals from DUT 100 by comparators 71 and 72 separately provided from one another, upon receiving the differential output signals 101 and 102, respectively.

In this circuit configuration, the low/high evaluation of the DUT differential output signals is made through logic comparison in the comparators with predetermined reference voltages VO81 and VO82 given to the corresponding comparators 71 and 72. The reference voltages VO81 and VO82 are variable voltages for defining threshold voltages of the comparators. Strobe signals 61 and 62 are provided to the comparators to define comparison timings by the comparators 71 and 72.

As a first example, the DUT output waveform is shown in FIG. 5(a). When a common mode peak is generated by the effects such as noise or other causes, the peak will be detected as an abnormal signal at the output of one of the comparators.

When this kind of DUT output waveform is generated, DUT is judged as defective in the single output test wherein only one of the output signals is evaluated. However, under the differential output situation, such a common mode noise is sometimes considered non-defective in a practical use. Thus, a quality test in this differential signal mode is necessary with more precise and detailed test capability.

However, in the conventional test method, the differential output test is difficult to perform, and DUTs are frequently determined as defective even though the DUTs should be acceptable.

FIG. 5(b) shows a second example of differential output signals where the DUT output signals have a relatively large transition timing difference from one another. In such a situation, an accurate timing of the cross point of the differential output signals may not be detected since there is a time difference between an actual transition timing T90 and the output timings T91 and T92 which are the comparison results from both of the comparators. Thus, in the conventional technology, unwanted test results are sometimes produced.

As explained above, because of the circuit configuration of the conventional technology that logically compares the differential output signals 101 and 102 by each separate comparator, unwanted test results arise. For example, when the output signal level is small or when there is much noise, a comparison result will be attained which does not accurately reflect the high/low level or the transition timing of the differential output signals.

SUMMARY OF THE INVENTION

Therefore, it is an object of the present invention to provide a comparator circuit for differential output signals which is not affected by common mode signals by establishing a special comparator circuit of a differential receiver type to meet the requirements for testing the DUT differential output signals.

FIG. 1 shows a first solution according to the present invention.

In order to solve the problems noted above, the comparator circuit of the present invention is comprised of: an offset circuit 30 that generates output signals 111 and 112 that are provided with predetermined offset voltages upon receiving differential output signals 101 and 102, respectively, from DUT; and a comparator 71 that compares both output signals from the offset circuit 30 and outputs a comparison result.

According to this arrangement of the invention, a comparator circuit for differential output signals to be used in a semiconductor test system is achieved which is not affected by common mode signals for testing differential mode operations between the differential output signals 101 and 102 from DUT 100.

FIG. 4 shows a second solution according to the present invention.

In order to solve the problems noted above, the comparator circuit of the present invention is comprised of: a switch SW51 that receives one differential output signal 101 from DUT and switches between the differential signal 101 and circuit earth potential; a switch SW52 that receives the other differential output signal 102 from the DUT and switches between the differential signal 102 and the circuit earth potential; an offset circuit 30 that receives signals from the switches SW51 and SW52 and generates output signals 111 and 112 which are provided with predetermined offset voltages; and a comparator 71 that receives both output signals 111 and 112 from the offset circuit 30 and compares between the two signals to output comparison results.

According to this arrangement of the present invention, a comparator circuit is achieved which is capable of switching between the differential output test that is not affected by the common mode noise and the single output test that separately tests each of the differential output signals 101 and 102.

The offset circuit 30 receives the differential output signals 101 and 102 from DUT, and provides an offset voltage predetermined by a comparison voltage 83 to the received signals.

In the above embodiment, the switches SW51 and SW52 are used to switch to the earth potential. However, it is not limited to the earth potential but other fixed potential can be switched.

FIG. 3 shows a third solution according to the present invention.

In order to solve the problems described above, the comparator circuit of the present invention is comprised of: a differential amplifier 76 that receives the differential output signals 101 and 102 from DUT and amplifies the difference between the received signals; and a comparator 71 that receives the amplified signal from the amplifier 76 at one input terminal and a threshold voltage VO83 at another input terminal and compares voltages between the two input terminals.

FIG. 7 shows a fourth solution according to the present invention.

In order to solve the problems described above, the comparator circuit of the present invention includes switches SW51 and SW52 for receiving the differential output signals 101 and 102 and switching between the test mode of the conventional technology having two separate comparators and the test mode of one of the present invention which is arranged not to be affected by the common mode noise.

FIG. 9 shows a fifth solution according to the present invention.

In order to solve the problems described above, the comparator circuit of the present invention includes switches SW55, SW56, SW57 and SW58 so that both the comparator circuit for DUT differential output test of the present invention and the comparator circuit of the conventional technology for single output test can be selected at the same time. Thus, both the single output test and the differential output test can be performed simultaneously.

BRIEF DESCRIPTION OF THE DRAWINGS

FIG. 5(*b*) is a diagram for showing a situation of timing deviations between the comparators in the conventional technology using the two comparators when each of the DUT output signals has a transition timing significantly different from the other.

DESCRIPTION OF THE PREFERRED EMBODIMENT

The present invention is characterized in the configuration of the comparator circuit which outputs a logic comparison result of the differential output signals 101 and 102 from DUT by a comparator after a predetermined offset voltage is supplied between the differential output signals 101 and 102.

The predetermined offset voltage in this example is established based on the relative voltage value between the differential output signals 101 and 102.

That is, the offset voltage VO83 is equal to the voltage difference between the threshold voltages VO81 and VO82 in the conventional example. A DUT's operational margin is tested based on this relative offset voltage.

Figure 1:
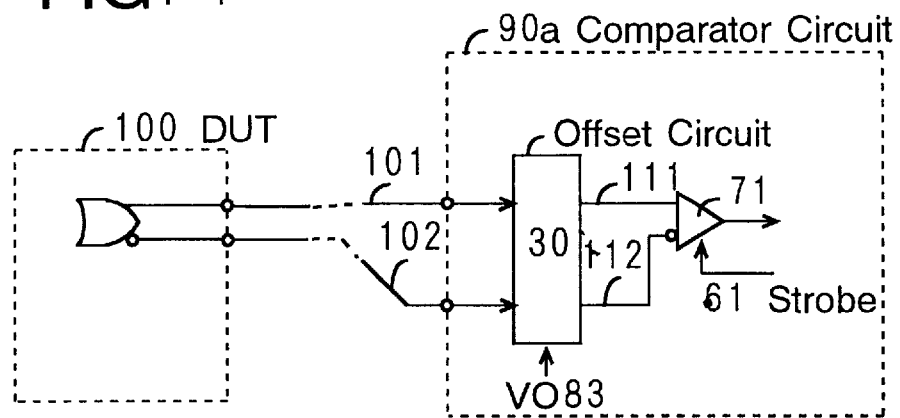
FIG. 1 is a block diagram showing a basic circuit configuration of a comparator circuit of the present invention for comparing and judging balanced transmission signals from DUT in one channel of a test system.

The embodiment of the present invention is explained in the following with reference to the configuration of FIGS. 1 and 2 which show a comparator circuit of one channel of a semiconductor test system.

The basic circuit configuration of a comparator circuit 90*a* of the present invention that compares balanced transmission signals from DUT is formed with an offset circuit 30 and a comparator 71. The comparator 71 is the same as the conventional one.

The offset circuit 30, upon receiving the differential signals 101 and 102, adds a predetermined offset voltage between the two received signals. The inner circuit configuration of the offset circuit 30 is shown in FIG. 2.

Figure 2:
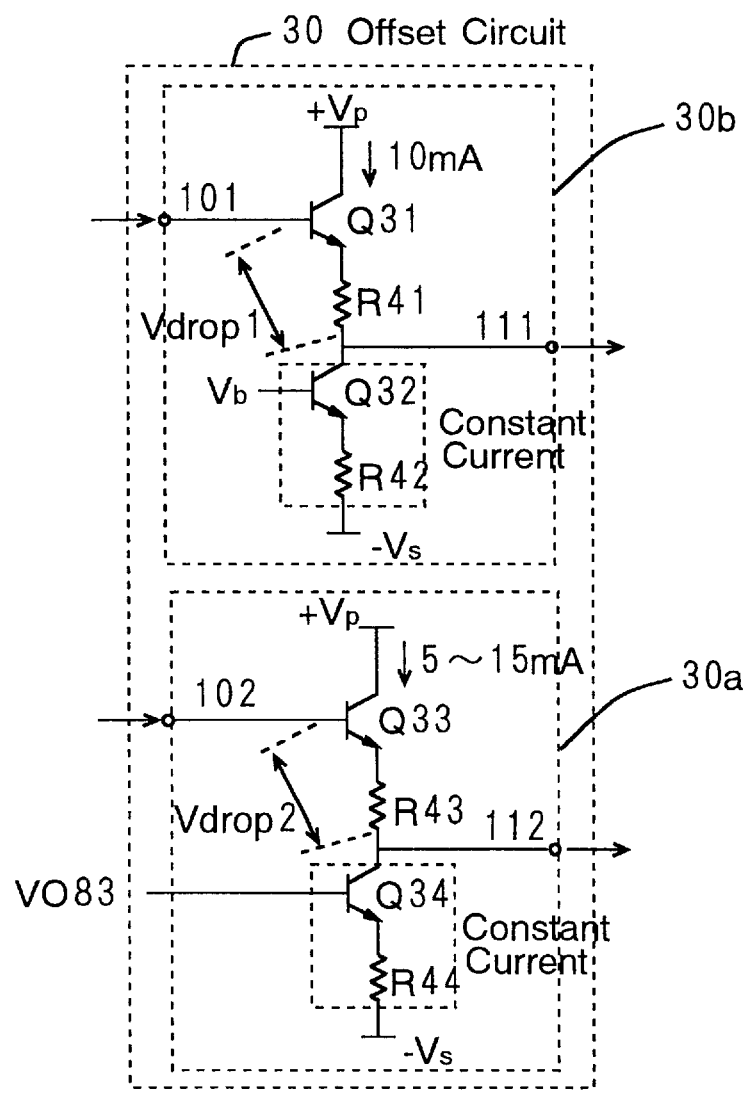
FIG. 2 is a circuit diagram showing an example of internal configuration of an offset circuit 30 of the present invention.

In the example of circuit configuration of FIG. 2, the offset circuit 30 is formed with an offset supply circuit 30*a* and a balance circuit 30*b*. The balance circuit 30*b* is a dummy circuit to establish a direct current balance as well as a propagation delay balance and a temperature balance between an output signal 112 from the offset supply circuit 30*a* and an output signal 111 from the balance circuit 30*b*. For doing this, the balance circuit 30*b* creates a voltage drop Vdrop1 by a transistor Q31 and a resistor R41 to match the voltage drop Vdrop2 caused by a transistor Q33 and a resistor R43 of the offset supply circuit 30*a*. Because of a transistor Q32, a resistor R42 and a fixed voltage Vb, a constant current source of for example 10 mA is created so that the output signal 111 which is lower than the voltage of the input differential signal 101 by the voltage drop Vdrop1 is generated by the balance circuit 30*b*.

Similar to the balance circuit 30*b*, the offset supply circuit 30*a* produces the output signal 112 which is lower than the voltage of the input differential signal 102 by the voltage drop Vdrop2. However, the comparison voltage VO83 is provided from an external source to the base of a transistor Q34 to produce a constant current. Because the comparison voltage VO83 is adjustable, electric current from the constant current source formed by the transistor Q34, a resistor R44 and the comparison voltage VO83 is also variable, which changes the voltage drop Vdrop2. Therefore, the output signal 112 from the offset supply circuit 30*a* can be provided with a desired offset voltage. This function is equivalent to the comparator circuit of conventional technology where variable threshold levels are provided to the comparators.

The offset circuit 30 is preferably used after the comparator is fully calibrated in such a case where parameters change as a function of time.

Figure 5:
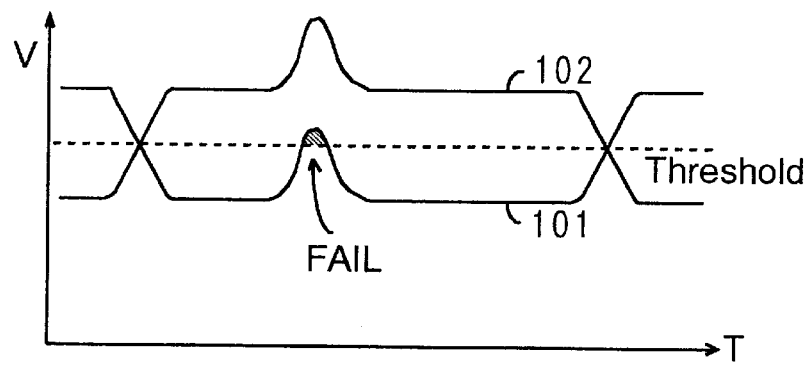
FIG. 5(*a*) is a diagram for showing a situation of erroneous logic detection by the comparators in the conventional technology using two separate comparators when the DUT output signals include a common mode peak.
Figure 5:
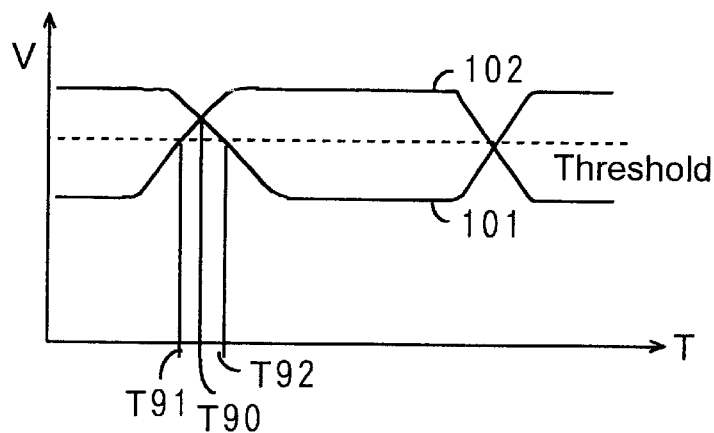
Figure 6:
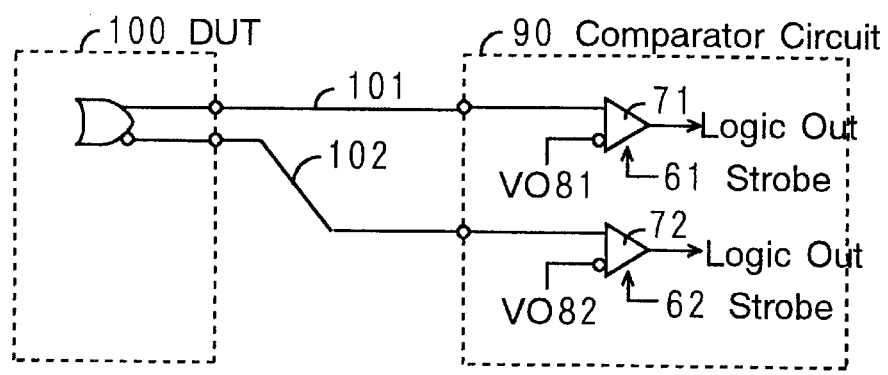
FIG. 6 is a block diagram showing a basic circuit configuration of a conventional comparator circuit for comparing and judging balanced transmission signals from DUT in one channel of a semiconductor test system.

As a consequence, the difference between the differential output signals 101 and 102 from the DUT is supplied to the comparator 71 whereby a logic comparison is performed as the differential output test. In the differential output test, the drawbacks found in the conventional technology caused by the common mode peak shown in FIG. 5(a) or the timing difference between the transition timings of the differential output signals 101 and 102 shown in FIG. 5(b) do not exist.

Figure 8:
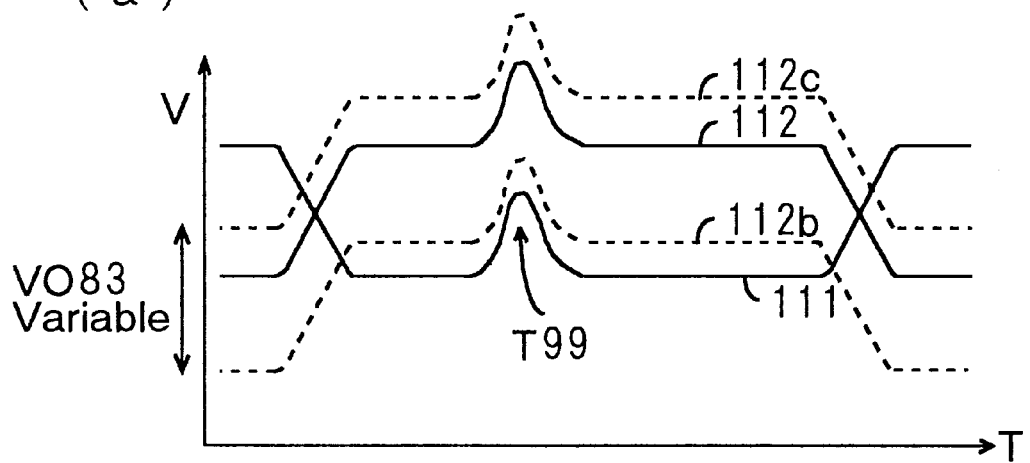
FIG. 8 is a schematic diagram for explaining the performance of the present invention for comparing and judging the differential output signals from DUT.
Figure 8:
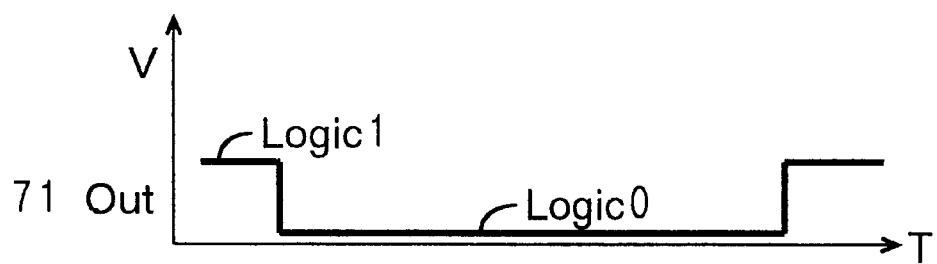

FIG. 8 is a schematic diagram for explaining the performance of the present invention for comparing and judging the differential output signals from DUT.

The differential signals 111 and 112 in FIG. 8(a) are signals corresponding to the differential output signals 101 and 102 from DUT. FIG. 8(a) shows a situation wherein the differential signal 112 is changing like 112b and 112c in response to the change of the comparison voltage VO83 from the external source, in contrast to the differential signal 111 that is fixed.

FIG. 8(b) shows an output waveform of a comparator 71 wherein the strobe is swept for a certain time length. As shown in FIG. 8(b), the comparison result is not affected by the common mode noise.

In this manner, the DUT can be tested in a situation similar to the actual application.

Figure 3:
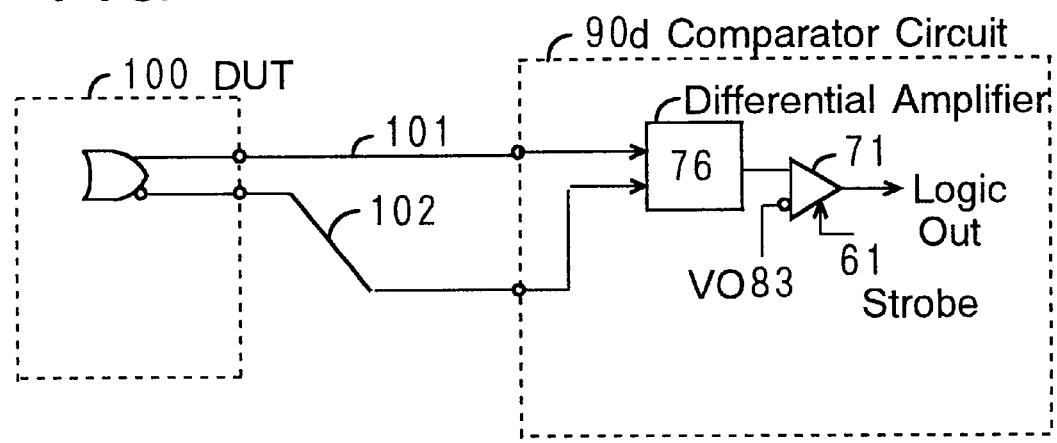
FIG. 3 is a block diagram showing an example of a comparator circuit of the present invention using a differential amplifier 76 and a comparator 71.

In the circuit configuration of the above embodiment, the offset circuit 30 is provided just before the comparator 71 to supply the offset voltage. However, as shown in FIG. 3, a circuit configuration of a comparator circuit 90d is also possible wherein a differential amplifier 76 is provided to amplify the differential signals input thereto, and the output signal from the amplifier is provided to one input terminal of the comparator 71 while the threshold comparison voltage VO83 is provided to the other input terminal.

The gain of the amplifier may be set to either a unit gain, an n gain or a minus n gain.

Figure 4:
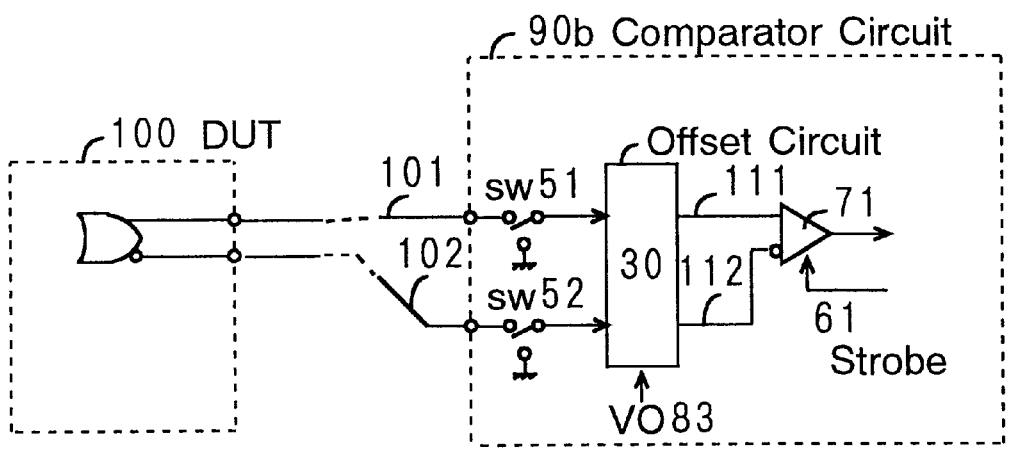
FIG. 4 is a block diagram showing a basic circuit configuration of a comparator circuit which is provided with switches to additionally include a single output test function for the DUT differential output signals 101 and 102 according to the present invention.

In the foregoing description of the embodiment, the circuit example is explained as to the test item which evaluates whether the differential output signals from DUT are functioning properly or not. However, as shown in FIG. 4, the comparator circuit 90b of the present invention can also be configured to additionally perform another test item, i.e., the single output test wherein each of the differential output signals is evaluated separately from one another by having switches SW51 and SW52 for switching between the two test items.

Figure 7:
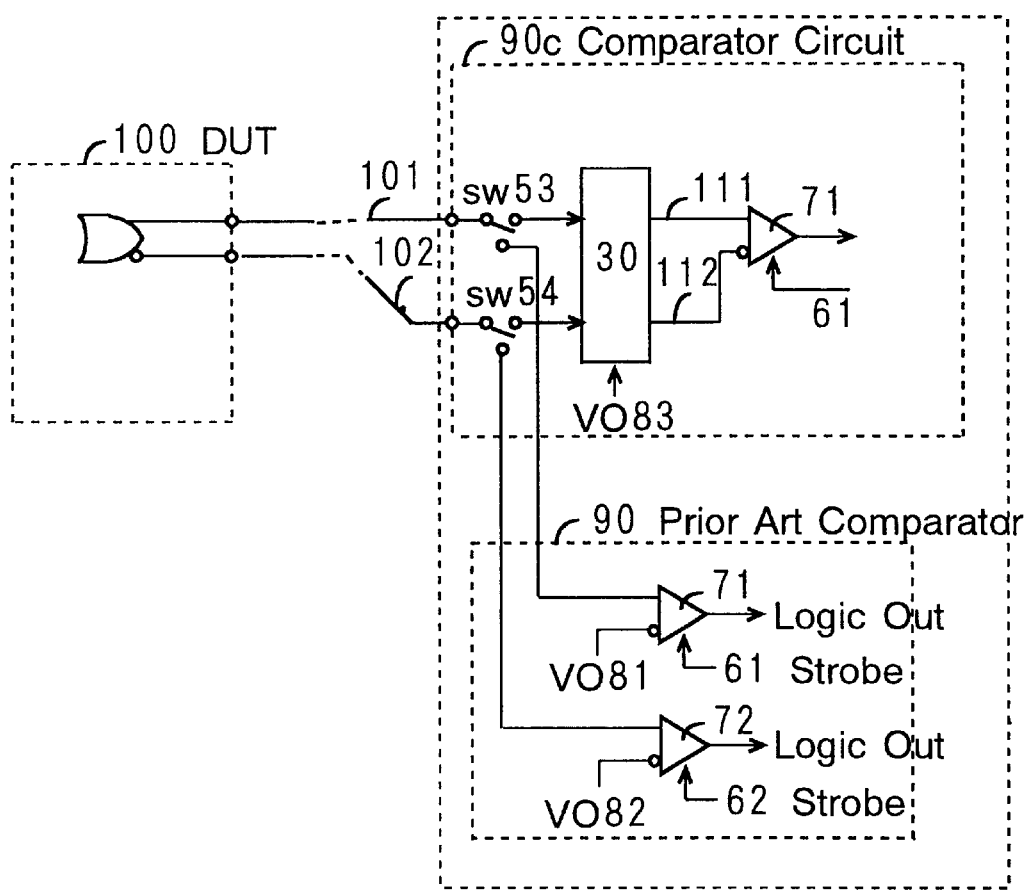
FIG. 7 is a block diagram showing an example of comparator circuit of the present invention wherein a comparator circuit that compares differential output signals and a conventional comparator circuit are switched therebetween.

In the foregoing explanation of the embodiment, only the comparator circuit of the present invention for evaluating the DUT differential output signals is shown. However, as shown in FIG. 7, the comparator circuit configuration can be arranged in such a way that both of the conventional comparator circuit 90 and the comparator 90c of the present invention that compares the differential output signals are provided therein as well as switches SW53, SW54 for switching the output signals from DUT.

Figure 9:
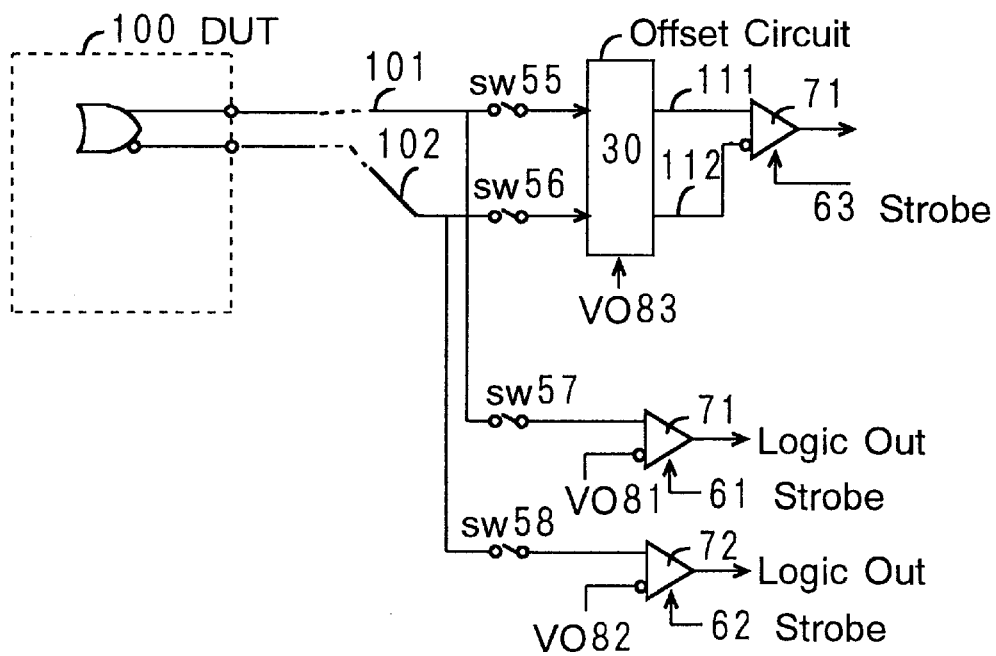
FIG. 9 is a block diagram showing an example of comparator circuit of the present invention wherein switches are provided to perform the single output test and the balanced transmission test for the DUT differential output signals 101 and 102 at the same time.

Furthermore, as shown in FIG. 9, switches SW55, SW56, SW57 and SW58 may be provided so that the comparator circuit of the present invention for evaluating the DUT differential output signals and the comparator circuit of the conventional technology for evaluating the single output signal can be selected at the same time. Thus, in this example, both the single output signal test and the differential output signal test can be performed simultaneously.

Thus, there is an advantage that the time required for the two kinds of test can be reduced to the time equivalent to one kind of test.

Since it is configured as described in the foregoing, the present invention has the following effects.

According to the present invention, the comparator circuit for differential output signals to be used in a semiconductor test system is achieved which is not affected by the common mode signals for comparing between the differential output signals 101 and 102 from DUT by freely providing an offset voltage.

What is claimed is:

1. A comparator circuit for a semiconductor test system for testing differential characteristics between differential signals that are output from DUT, comprising:

a first switch which receives one of differential signals from said DUT, and outputs either the differential signal or fixed potential by switching between the two;

a second switch which receives another differential signal from said DUT, and outputs either the differential signal or said fixed potential by switching between the two;

an offset circuit which receives said differential signals from said first and second switches and generates output signals provided with a predetermined offset voltage; and a comparator which receives both of said output signals from said offset circuit and compares therebetween.

2. A comparator circuit for a semiconductor test system as defined in claim 1 wherein said offset circuit receives said differential signals and supplies a predetermined offset voltage between said differential signals based on a comparison voltage.

3. A comparator circuit for a semiconductor test system for testing differential characteristics between differential signals that are output from DUT, comprising:

first and second switches for receiving one of said differential signals from said DUT and selectively outputting the differential signal;

third and fourth switches for receiving another differential signal from said DUT and selectively outputting the differential signal;

an offset circuit for receiving said differential signals from said first and third switches and generating output signals which are provided with a predetermined offset voltage;

a first comparator for receiving both of said output signals from said offset circuit and comparing voltages between said outputs signals;

a second comparator for receiving said one of said differential signals from said second switch and a predetermined offset voltage and comparing voltages between the two; and a third comparator (72) for receiving said another differential signal from said fourth switch and a predetermined offset voltage and comparing voltages between the two.

4. A comparator circuit for a semiconductor test system as defined in claim 3 wherein said offset circuit receives said differential signals and supplies a predetermined offset voltage between said differential signals based on a comparison voltage.

* * * * *